United States Patent
Kawai (10) Patent No.: US 9,102,067 B2
(45) Date of Patent: Aug. 11, 2015

(54) SENSOR ELEMENT, FORCE DETECTING DEVICE, ROBOT AND SENSOR DEVICE

(71) Applicant: Seiko Epson Corporation, Tokyo (JP)

(72) Inventor: Hiroki Kawai, Chino (JP)

(73) Assignee: Seiko Epson Corporation (JP)

( * ) Notice: Subject to any disclaimer, the term of this patent is extended or adjusted under 35 U.S.C. 154(b) by 212 days.

(21) Appl. No.: 13/669,879

(22) Filed: Nov. 6, 2012

(65) Prior Publication Data

US 2013/0112011 A1     May 9, 2013

(30) Foreign Application Priority Data

Nov. 8, 2011   (JP) ................ 2011-244208

(51) Int. Cl.
  *G01L 1/16* (2006.01)
  *B25J 19/02* (2006.01)
  *G01L 5/16* (2006.01)

(52) U.S. Cl.
  CPC ............... *B25J 19/028* (2013.01); *G01L 1/16* (2013.01); *G01L 1/162* (2013.01); *G01L 5/167* (2013.01)

(58) Field of Classification Search
  CPC ..... H03H 9/02023; H03H 9/19; H03H 9/215; G01P 15/0907; G01P 15/0915; B25J 13/082; B25J 19/028; G01L 1/16; G01L 5/226; G01L 1/162; G01L 5/167
  USPC ......... 310/361, 360, 338, 357, 365; 29/25.35; 73/862.621, 862.625, 73/862.041–862.046, 862, 862.627, 73/862.626, 862.628, 862.629, 862.632, 73/862.633, 862.636, 862.638
  See application file for complete search history.

(56) References Cited

U.S. PATENT DOCUMENTS

| | | | | |
|---|---|---|---|---|
| 2,173,589 | A | * | 9/1939 | Mason et al. .............. 310/361 |
| 2,743,144 | A | * | 4/1956 | Bottom et al. ............. 310/361 |
| 3,084,228 | A | * | 4/1963 | Shiga ...................... 369/137 |
| 3,202,846 | A | * | 8/1965 | Ballato et al. ............ 310/361 |
| 3,735,161 | A | * | 5/1973 | Perkins et al. ............ 310/329 |
| RE29,755 | E | * | 9/1978 | Perkins et al. ............ 310/329 |
| 4,667,997 | A | * | 5/1987 | Udagawa et al. ........... 294/86.4 |
| 4,802,371 | A | | 2/1989 | Calderara et al. |
| 5,297,430 | A | | 3/1994 | Sonderegger et al. |
| 6,098,460 | A | | 8/2000 | Otsuchi et al. |
| 7,365,478 | B2 | * | 4/2008 | Kawashima ............... 310/370 |
| 2002/0171328 | A1 | | 11/2002 | Otsuchi et al. |
| 2010/0132471 | A1 | * | 6/2010 | Hedtke et al. .............. 73/702 |
| 2012/0229223 | A1 | * | 9/2012 | Ii et al. .................... 331/155 |
| 2012/0306321 | A1 | * | 12/2012 | Ishii ........................ 310/348 |

FOREIGN PATENT DOCUMENTS

| | | |
|---|---|---|
| EP | 0549346 A2 | 6/1993 |
| JP | 60-034294 | 2/1985 |
| JP | 63-128682 | 6/1988 |

(Continued)

*Primary Examiner* — Lisa Caputo
*Assistant Examiner* — Jonathan Dunlap
(74) *Attorney, Agent, or Firm* — Harness, Dickey & Pierce, P.L.C.

(57) ABSTRACT

A sensor element includes a piezoelectric substrate made of a trigonal single crystal and an electrode arranged on the piezoelectric substrate. The substrate surface of the piezoelectric substrate includes an electrical axis of crystal axes. An angle θ formed by the substrate surface and a plane including the electrical axis and an optical axis of the crystal axes is $0° < θ < 20°$.

10 Claims, 11 Drawing Sheets

(56) References Cited

FOREIGN PATENT DOCUMENTS

| JP | 04-231827 | 8/1992 |
| JP | H05-172680 A | 7/1993 |
| JP | 07-209126 | 8/1995 |
| JP | 10-096742 | 4/1998 |
| JP | 11-261127 | 9/1999 |
| JP | 2006-250711 | 9/2006 |
| JP | 2007-057389 | 3/2007 |
| JP | 2007-139504 | 6/2007 |
| JP | 2009-295788 | 12/2009 |

* cited by examiner

SENSOR ELEMENT, FORCE DETECTING DEVICE, ROBOT AND SENSOR DEVICE

BACKGROUND

1. Technical Field

The present invention relates to a sensor element, a force detecting device and a robot.

2. Related Art

JP-A-4-231827 discloses a known force sensor using a piezoelectric material. As shown in FIG. 15 of JP-A-4-231827 plural measuring elements are arranged on the force sensor. Each measuring element includes a signal electrode 15 held between crystal disks 16. The crystal disks 16 are made of a piezoelectric material and are covered with a metal cover disk 17.

JP-A-4-231827 discloses the use of quartz, which suggests rock crystal, as a piezoelectric material, and maintains that quartz is an optimum material for measuring a multiple-component motive force since quartz receives both compressive and shear stress according to the crystal cut of the quartz. However, there is no description regarding the slicing of the piezoelectric material in a specific crystal direction.

SUMMARY

An advantage of some aspects of the invention is to provide a sensor element which can detect a force with high sensitivity by finding a condition of use of a piezoelectric material that enables the generation of more electric charge in response to an external force, a sensor device and a force detecting device using this sensor element, and a robot with high reliability and safety having this force detecting device.

The invention can be implemented in the following forms or application examples.

APPLICATION EXAMPLE 1

This application example is directed to a sensor element including a piezoelectric substrate made of a trigonal single crystal, a first electrode arranged on one substrate surface of the piezoelectric substrate, and a second electrode arranged on the other substrate surface. The substrate surface of the piezoelectric substrate includes an X-axis (electrical axis) of crystal axes. An angle θ formed by the substrate surface and a plane including the X-axis (electrical axis) and a Z-axis (optical axis) of the crystal axes is 0°<θ<20°.

According to the sensor element of this application example, compared with the case where a so-called Y-cut plate with θ=0° is used as the piezoelectric substrate of the sensor element, the amount of electric charge generated by a shear force applied to the piezoelectric substrate can be increased and a sensor element with high detection capability can be provided.

APPLICATION EXAMPLE 2

This application example is directed to the above application example, wherein a portion of an outer surface that intersects the substrate surface of the piezoelectric substrate includes a plane extending in the X-axis direction.

According to this application example, the plane of the site where a large strain is generated by a shear force applied to the piezoelectric substrate extends in the direction of the shear force. Therefore, a site where a large amount of electric charge is generated can be formed on the piezoelectric substrate and a sensor element with high detection capability can be provided.

APPLICATION EXAMPLE 3

This application example is directed to a sensor element including a piezoelectric substrate made of a trigonal single crystal, a first electrode arranged on one substrate surface of the piezoelectric substrate, and a second electrode arranged on the other substrate surface. The substrate surface of the piezoelectric substrate has crystal axes including a Y-axis (mechanical axis) and a Z-axis (optical axis). A portion of an outer surface intersecting the substrate surface includes a plane. An angle λ formed by the plane of the outer surface and a plane including an X-axis (electrical axis) and the Z-axis (optical axis) of the crystal axes is 25°≤λ≤85°.

According to the sensor element of this application example, compared with the case where an X-cut plate with λ=0° is used as the piezoelectric substrate of the sensor element, a site where a large strain is generated by a compressive force applied to the piezoelectric substrate extends to an outer part of the piezoelectric substrate and therefore an electric charge generation site area where more electric charge is generated by an increase in the strain is broadened. Thus, a sensor element with high detection capability can be provided.

APPLICATION EXAMPLE 4

This application example is directed to the above application example, where the single crystal is a rock crystal.

According to this application example, by using a rock crystal substrate as the piezoelectric substrate, a large amount of electric charge can be generated even with a very small strain and a sensor element with high detection capability can be provided. Moreover, a single crystal can be easily obtained and a piezoelectric substrate with excellent workability and quality stability can be formed. Thus, a sensor element capable of stable detection can be provided.

APPLICATION EXAMPLE 5

This application example is directed to a force detecting device including the above sensor element, and an arithmetic unit which detects an amount of electric charge induced in the first electrode or the second electrode and calculates a force applied to the sensor element.

According to the force detecting device of this application example, a triaxial force detecting device can be provided with a simple configuration. Also, by using plural such triaxial force detecting devices, for example, a six-axis force detecting device including torque measuring can be easily provided.

APPLICATION EXAMPLE 6

This application example is directed to a robot including the above sensor element, and an arithmetic unit which detects an amount of electric charge induced in the first electrode or the second electrode and calculates a force applied to the sensor element.

According to the robot of this application example, a contact with an obstacle and a contacting force to an object during a predetermined operation of a robot arm or robot hand that make differential movements are securely detected by a force detecting device and data is fed back to a robot control device. Thus, a robot capable of performing safe and fine work can be provided.

BRIEF DESCRIPTION OF THE DRAWINGS

The invention will be described with reference to the accompanying drawings, wherein like numbers reference like elements.

FIGS. 1A to 1C show a sensor element according to a first embodiment.

FIGS. 3A to 3C show a sensor element according to a second embodiment.

FIGS. 7A to 7C show sensor devices as other forms of the third embodiment.

FIGS. 8A and 8B show a force detecting device according to a fourth embodiment.

FIGS. 9A and 9B show another force detecting device according to the fourth embodiment.

FIGS. 11A and 11B are graphs showing examples of implementation.

DESCRIPTION OF EXEMPLARY EMBODIMENTS

Hereinafter, embodiments of the invention will be described.

First Embodiment

Figure 1A:
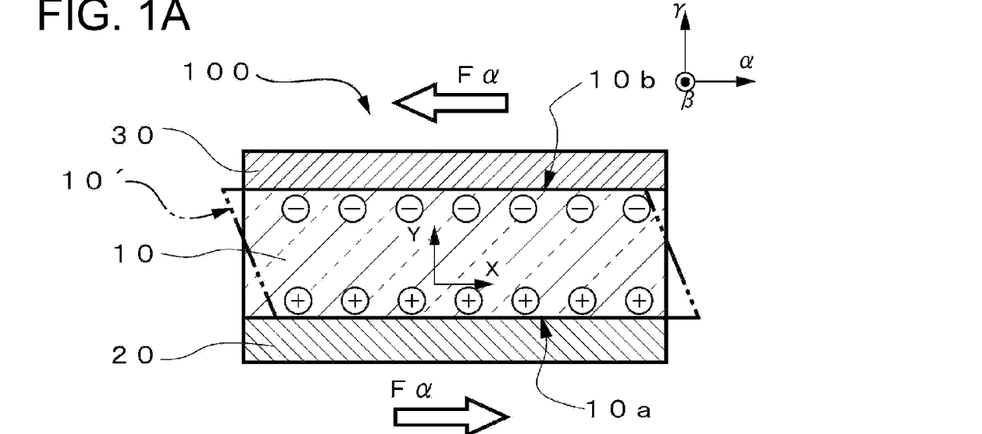
FIG. 1A is a sectional view.
Figures 1B, 1C:
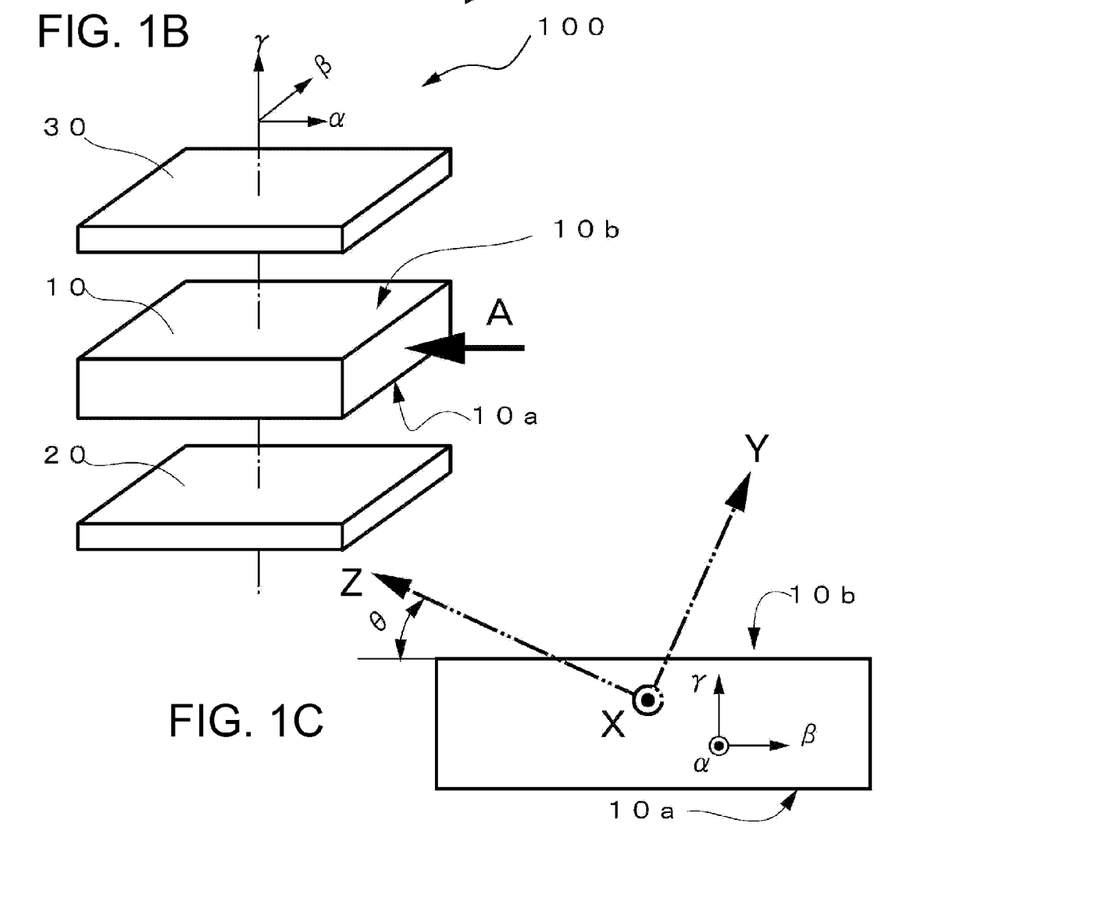
FIG. 1B is an exploded perspective view.
FIG. 1C is a view from the direction of an arrow A in FIG. 1B.

FIGS. 1A to 1C show a sensor element according to a first embodiment. FIG. 1A is a sectional view. FIG. 1B is an exploded perspective view. FIG. 1C is a view from the direction of an arrow A in FIG. 1B. A sensor element 100 shown in FIGS. 1A to 1C includes a rock crystal substrate 10 as a piezoelectric substrate, a detection electrode 20 as a first electrode, and a grounding electrode (hereinafter referred to as GND electrode) 30 as a second electrode. The material of the piezoelectric substrate is not limited to rock crystal as long as the material is a trigonal single crystal. A trigonal single crystal refers to a crystal which has crystal axes such that three symmetry axes with equal lengths intersect each other at an angle of 120°, with one vertical axis meeting the point of intersection. In addition to rock crystal, trigonal single crystals include langasite ($La_3Ga_5SiO_{14}$), lithium niobate ($LiNbO_3$) single crystal, lithium tantalate ($LiTaO_3$) single crystal, gallium phosphate ($GaPO_4$) single crystal, lithium borate ($Li_2B_4O_7$) single crystal and the like. In this embodiment, a rock crystal which can generate a large amount of electric charge even with a very small strain and can easily provide a single crystal and also has excellent workability and quality stability is used.

In the sensor element 100 shown in FIG. 1A, the detection electrode 20 is arranged on one substrate surface 10a of the rock crystal substrate 10, and the GND electrode 30 is arranged on the other substrate surface 10b. The rock crystal substrate 10 is held between the detection electrode and the GND electrode 30. That is, in terms of the illustrated coordinate axes $\alpha, \beta, \gamma$, the detection electrode 20, the rock crystal substrate 10 and the GND electrode 30 are stacked in this order in the $\gamma$ direction, thus forming the sensor element 100. If a force $F\alpha$ in a shear direction along the illustrated $\alpha$-axis direction is applied to the sensor element 100, the rock crystal substrate 10 is deformed into a shape like a deformed rock crystal substrate 10'. With the strain due to this deformation, electric charge is generated in the rock crystal substrate 10.

Here, in the case where the rock crystal substrate is made of a so-called Y-cut plate in which a plane intersecting the Y-axis as the mechanical axis of the crystal axes and including the X-axis as the electrical axis constitutes a main surface, if the deformation shown in FIG. 1A, that is, the strain that causes the deformation into the rock crystal substrate 10' is generated, positive (+) electric charge is generated inside the rock crystal substrate 10 on the side of the one substrate surface 10a of the rock crystal substrate 10 where the detection electrode 20 is arranged, and negative (−) electric charge is generated inside the rock crystal substrate 10 on the side of the other substrate surface 10b where the GND electrode 30 is arranged. The − electric charge on the side of the other substrate surface 10b is discharged to the ground (GND), not shown, by the GND electrode 30. The + electric charge on the side of the one substrate surface 10a is sent as a detection value to an arithmetic unit, not shown, by the detection electrode 20. Based on the resulting amount of electric charge, the force $F\alpha$ in the $\alpha$ direction is calculated.

In the rock crystal substrate 10 made of a rock crystal that is a trigonal single crystal as a piezoelectric body, electric charge is generated as described above by an internal strain. The amount of this electric charge increases and decreases depending on the angle of the substrate surfaces 10a, 10b of the rock crystal substrate 10 to the crystal axes X, Y, Z. A larger amount of electric charge can be obtained particularly depending on the following forming conditions of the substrate surfaces 10a, 10b.

FIG. 1C shows the rock crystal substrate 10, as viewed from the direction of the arrow A shown in FIG. 1B along the $\alpha$-axis. As shown in FIG. 1C, if the substrate surfaces 10a, 10b of the rock crystal substrate 10 are defined in terms of the crystal axes X, Y, Z, the rock crystal substrate 10 is sliced out with an angle $\theta$ formed by the one substrate surface 10a of the rock crystal substrate 10 and a plane defined by the Z-axis and X-axis.

Figure 2:
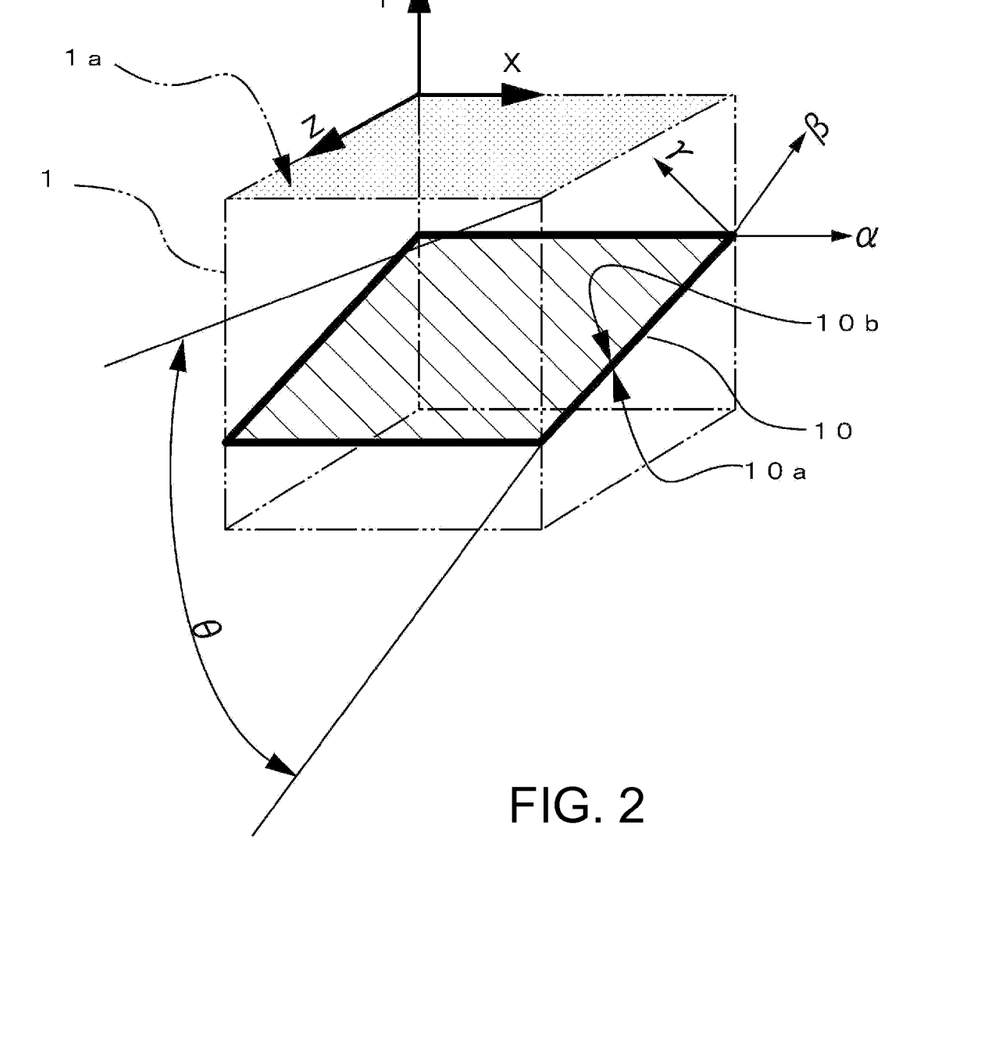
FIG. 2 is a schematic view showing a method for forming a rock crystal substrate according to the first embodiment in relation to crystal axes X, Y, and Z.

FIG. 2 schematically shows the method for forming the rock crystal substrate 10 in relation to the crystal axes X (electrical axis), Y (mechanical axis), Z (optical axis). As shown in FIG. 2, the rock crystal substrate 10 is formed in such a way that an angle formed by a surface 1a including the X-axis and Z-axis and orthogonal to the Y-axis, of a rock crystal body 1 sliced out along the crystal axes X, Y, Z, and the substrate surfaces 10a, 10b, within a plane defined by the Y-axis and Z-axis, becomes the angle $\theta$. The angle $\theta$ may be preferably formed within a range of 0°<θ<20°. By thus forming the rock crystal substrate 10, the amount of electric charge generated by the force Fα can be increased and a sensor element with high detection capability can be provided.

Second Embodiment

Figure 3A:
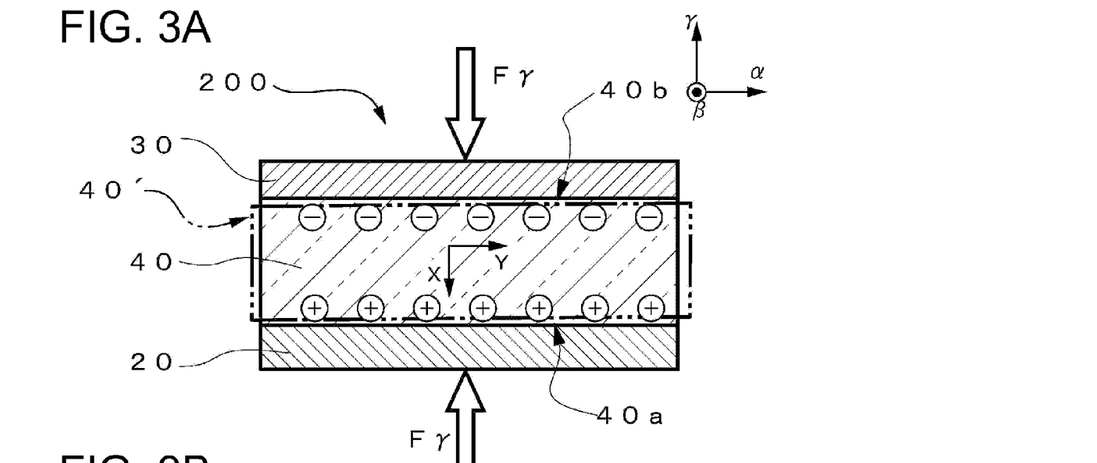
FIG. 3A is a sectional view.
Figures 3B, 3C:
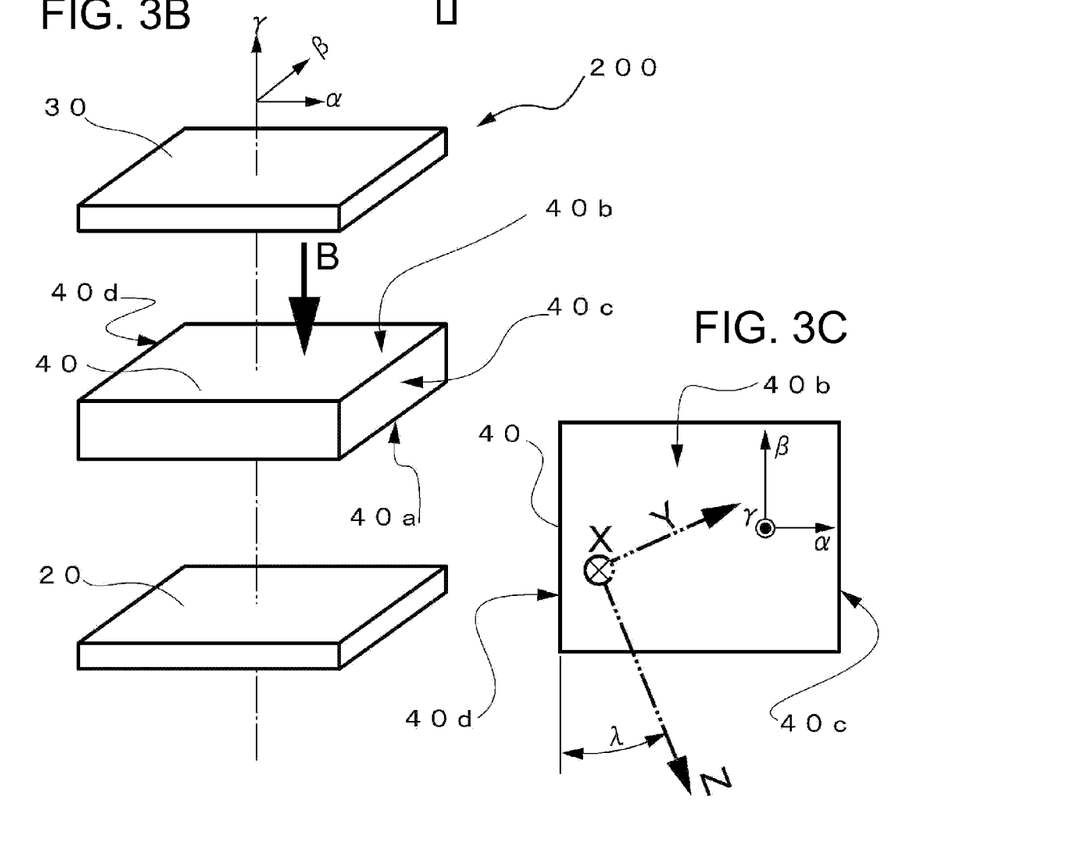
FIG. 3B is an exploded perspective view.
FIG. 3C is a view from the direction of an arrow B in FIG. 2B.

FIGS. 3A to 3C show a sensor element according to a second embodiment. FIG. 3A is a sectional view. FIG. 3B is an exploded perspective view. FIG. 3C is a view from the direction of an arrow B in FIG. 3B. A sensor element 200 according to the second embodiment is different in the form of the rock crystal substrate 10 from the sensor element 100 according to the first embodiment, and the other parts of the configuration are the same as the first embodiment. Therefore, the same parts of the configuration are denoted by the same reference numerals and will not be described further in detail. As shown in FIGS. 3A to 3C, the sensor element 200 according to the second embodiment is the sensor element 200 that detects a force Fγ in a direction in which a rock crystal substrate 40 is compressed, that is, in a γ direction. The sensor element 200 has a configuration in which a detection electrode 20 as a first electrode, the rock crystal substrate 40 as a piezoelectric substrate, and a GND electrode 30 as a second electrode are stacked in the γ direction. As in the sensor element 100 according to the first embodiment, the material of the piezoelectric substrate is not limited to rock crystal as long as the material is a trigonal single crystal. However, also in this embodiment, an example in which a rock crystal is used as a piezoelectric material is described.

If a compressive force Fγ in the γ direction is applied to the sensor element 200, as shown in FIG. 3A, the rock crystal substrate 40 is compressed and deformed into a shape like a rock crystal substrate 40'. With the strain due to this deformation, electric charge is generated in the rock crystal substrate 40. Here, the rock crystal substrate 40 is made of a so-called X-cut plate in which a plane intersecting the X-axis as the electrical axis of the crystal axes and including the Y-axis as the mechanical axis and the Z-axis as the optical axis constitutes a main surface. If the deformation shown in FIG. 3A, that is, the strain is generated, positive (+) electric charge is generated inside the rock crystal substrate 40 on the side of one substrate surface 40a of the rock crystal substrate 40 where the detection electrode 20 is arranged, and negative (−) electric charge is generated inside the rock crystal substrate 40 on the side of the other substrate surface 40b where the GND electrode 30 is arranged. The − electric charge on the side of the other substrate surface 40b is discharged to the ground (GND), not shown, by the GND electrode 30. The + electric charge on the side of the one substrate surface 40a is sent as a detection value to an arithmetic unit, not shown, by the detection electrode 20. Based on the resulting amount of electric charge, the force Fγ in the γ direction is calculated.

In the rock crystal substrate 40 made of a rock crystal that is a trigonal single crystal as a piezoelectric body, electric charge is generated as described above by an internal strain. The amount of this electric charge increases and decreases depending on the angle formed by planes 40c, 40d forming a part of an outer surface intersecting the substrate surfaces 40a, 40b of the rock crystal substrate 40 and the surface defined by the X-axis and Z-axis. A larger amount of electric charge can be obtained particularly depending on the following forming conditions of the planes 40c, 40d.

FIG. 3C shows a view from the direction of the arrow B shown in FIG. 3B. As shown in FIG. 3C, the outer surface forming the outer shape of the rock crystal substrate 40 includes at least one plane. In this embodiment, the outer surface includes the planes 40c, 40d. The rock crystal substrate 40 is sliced out in such a way that the plane 40d has an angle λ relative to a plane defined by the X-axis and Y-axis of the crystal axes. In this embodiment, the rock crystal substrate 40 is rectangular and the plane 40c and the plane 40d of the outer surface are substantially parallel to each other. Therefore, the rock crystal substrate 40 is sliced out in such a way that the plane 40c, too, has an angle λ relative to the plane defined by the X-axis and Y-axis of the crystal axes.

Figure 4:
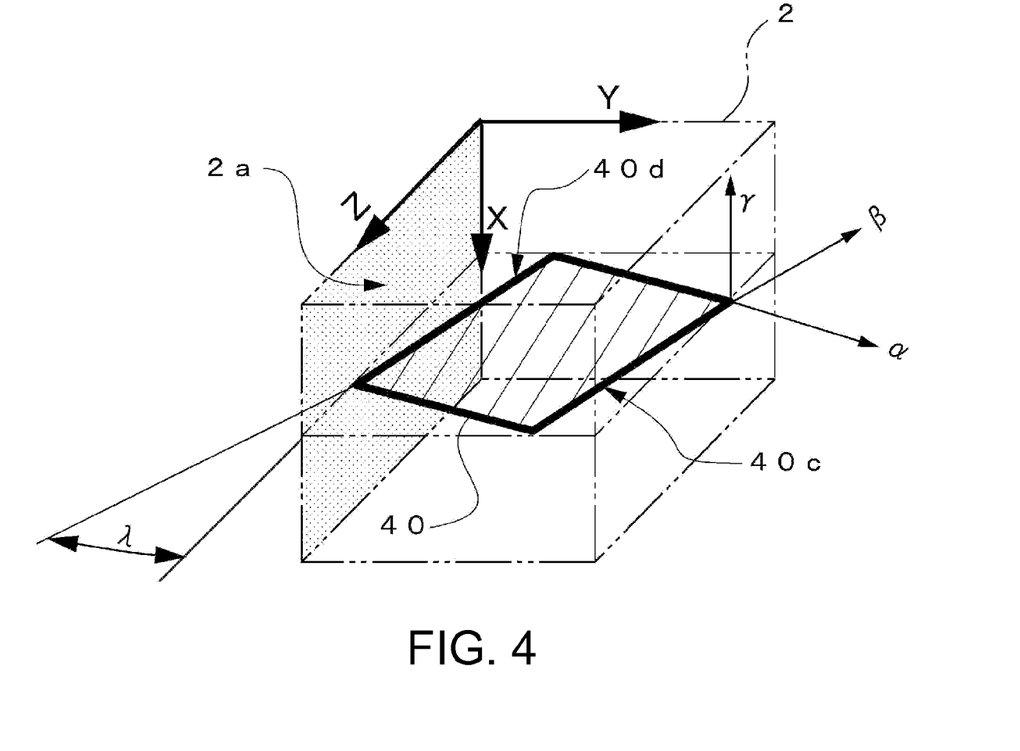
FIG. 4 is a schematic view showing a method for forming a rock crystal substrate according to the second embodiment in relation to crystal axes X, Y, and Z.

FIG. 4 schematically shows the method for forming the rock crystal substrate 40 in relation to the crystal axes X, Y, Z. As shown in FIG. 4, the rock crystal substrate 40 is formed in such a way that an angle formed by a surface 2a defined by the X-axis and Z-axis of a rock crystal body 2 sliced out along the crystal axes X, Y, Z and the plane 40d of the outer surface becomes the angle λ. Since the plane 40c is substantially parallel to the plane 40d, the rock crystal substrate 40 is formed in such a way that an angle formed by the surface 2a and the plane 40c becomes the angle λ, too. The angle λ may be preferably formed within a range of 25°≤λ≤85°. By thus forming the rock crystal substrate 40, the amount of electric charge generated by the force Fγ can be increased and a sensor element with high detection capability can be provided.

Figure 5A:
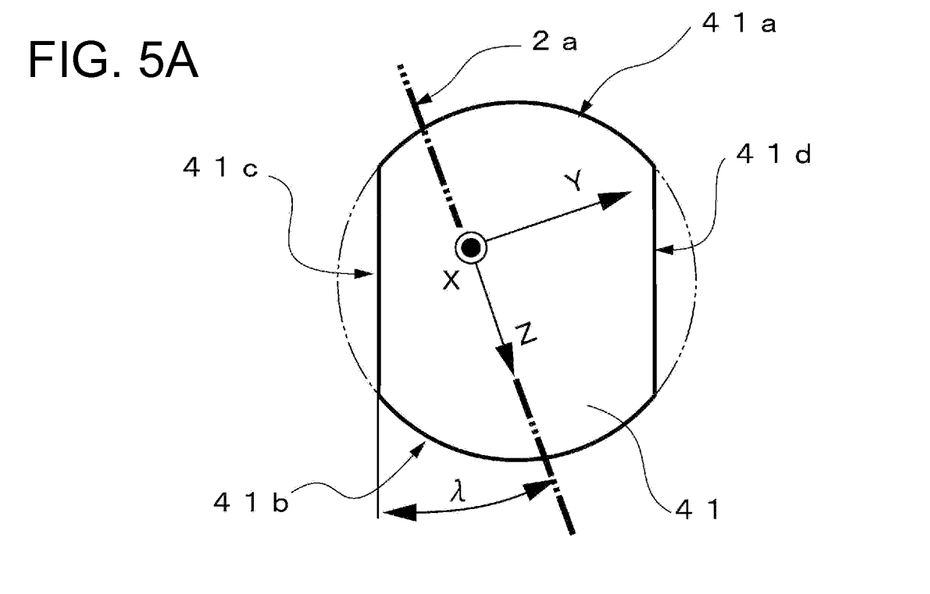
FIGS. 5A and 5B are plan views showing other forms of the rock crystal substrate according to the second embodiment.
Figure 5B:
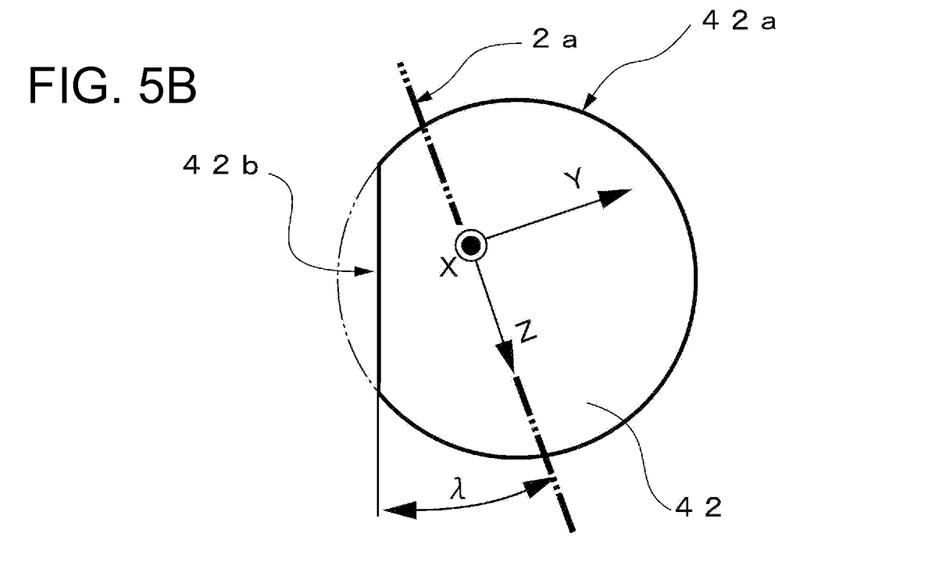

FIGS. 5A and 5B are views showing other forms of the rock crystal substrate 40. In the rock crystal substrate 40 according to the second embodiment, as described above, as the plane 40c or the plane 40d of the outer surface intersects the surface 2a (see FIG. 4) defined by the X-axis and Z-axis, at the angle λ, a large amount of electric charge is generated. Therefore, the outer surface except the planes 40c, 40d is not limited to a plane. That is, as in a rock crystal substrate 41 shown in FIG. 5A, parts other than a plane 41c or a plane 41d intersecting the surface 2a (see FIG. 4) defined by the X-axis and Z-axis, at the angle λ, may be round surfaces 41a, 41b. Also, as in a rock crystal substrate 42 shown in FIG. 5B, one plane 42b may intersect the surface 2a (see FIG. 4) defined by the X-axis and Z-axis, at the angle λ, and the other parts of the surface may be a round surface 42a or the like.

Third Embodiment

Figure 6:
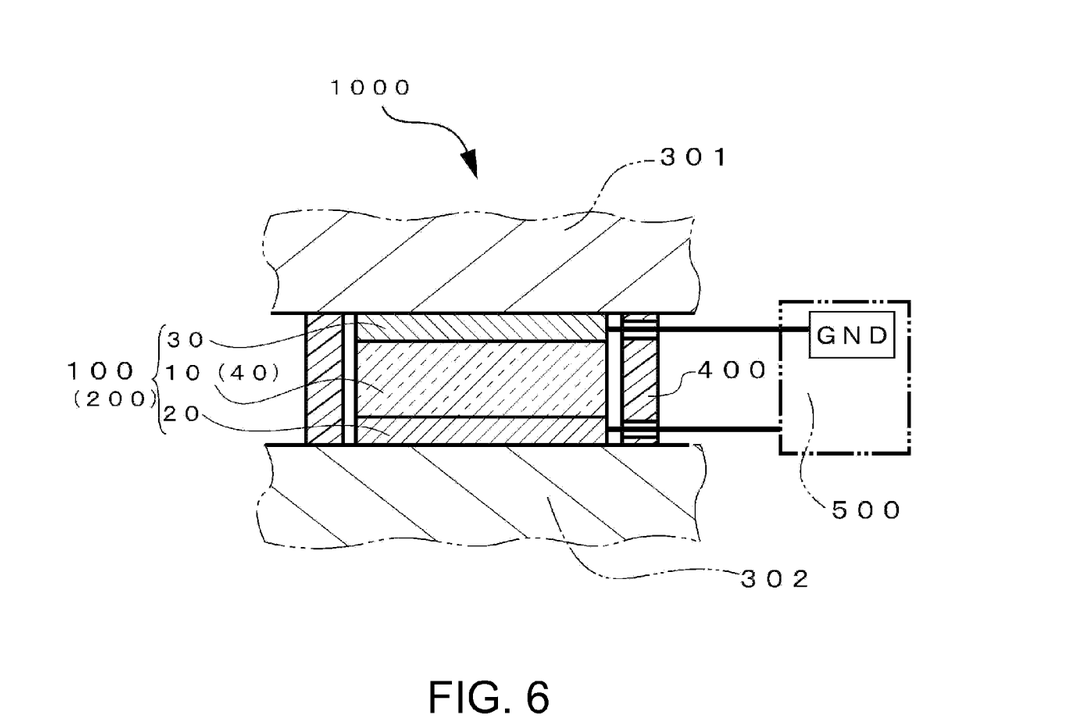
FIG. 6 is a sectional view showing a sensor device according to a third embodiment.

FIG. 6 is a sectional view showing a sensor device according to a third embodiment. As shown in FIG. 6, in a sensor device 1000, the sensor element 100 having the rock crystal substrate 10 or the sensor element 200 having the rock crystal substrate 40 is housed in a cylindrical container 400 and is pressed and fixed by bases 301, 302. The detection electrode 20 and the GND electrode 30 are electrically connected to an arithmetic unit 500. The arithmetic unit 500 includes a QV amplifier, not shown, which converts the electric charge obtained by the detection electrode 20, and also includes GND (ground) connected with the GND electrode 30. By employing such a configuration, the sensor device 1000 can easily detect a force applied between the base 301 and the base 302.

Figure 7A:
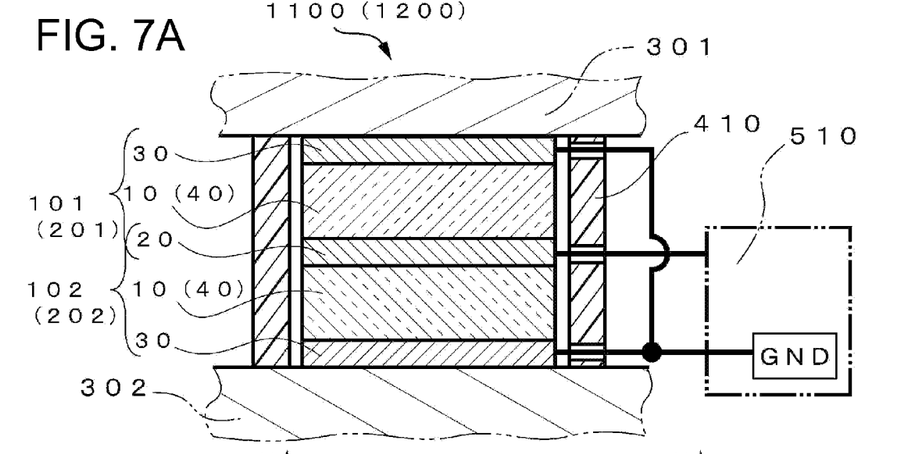
FIG. 7A is a sectional view.
Figure 7B:
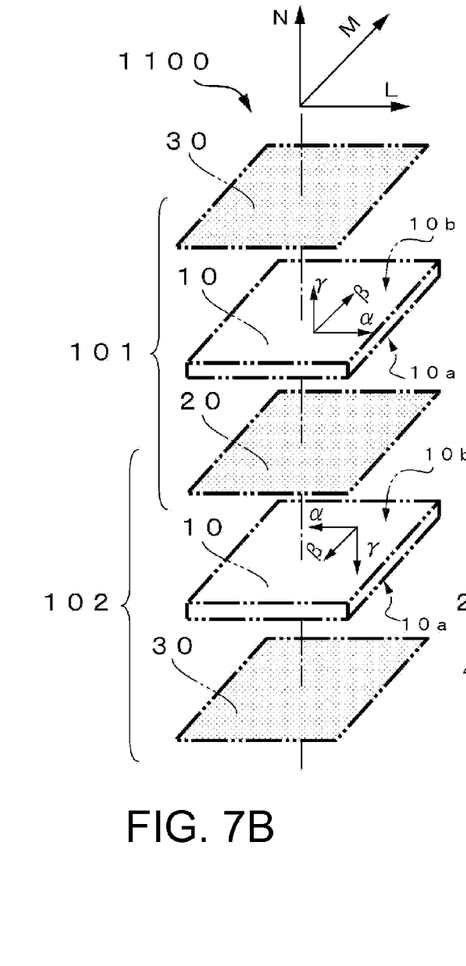
FIGS. 7B and 7C are exploded perspective views.
Figure 7C:
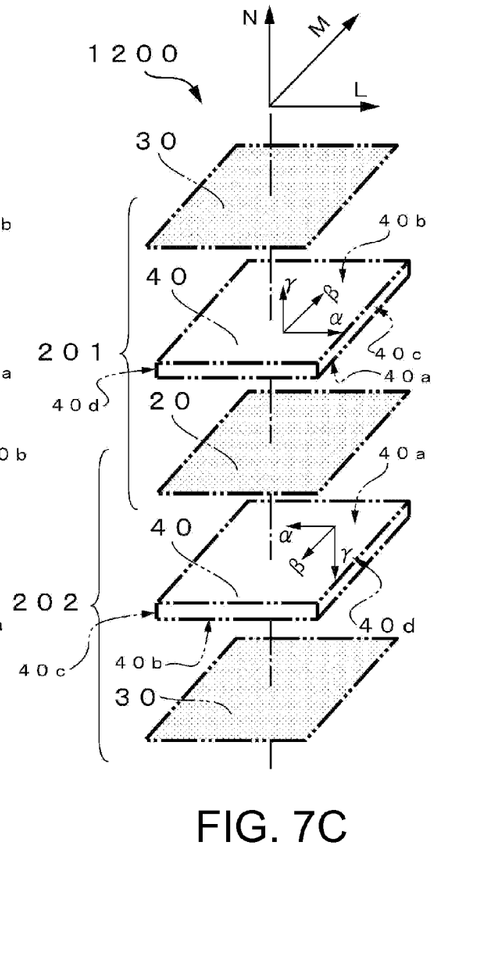

FIGS. 7A to 7C show sensor devices 1100, 1200 as other forms of the third embodiment. FIG. 7A is a sectional view. FIG. 7B is an exploded perspective view of the sensor device 1100. FIG. 7C is an exploded perspective view of the sensor device 1200. The sensor devices 1100, 1200 shown in FIGS. 7A to 7C have a configuration in which the rock crystal substrate 10 or the rock crystal substrate 40 as a piezoelectric substrate is arranged on both sides of the detection electrode 20, compared with the above sensor device 1000. That is, two sensor elements 100 or two sensor elements 200 are stacked, sharing the detection electrode 20. As shown in FIG. 7A, in the sensor device 1100, a sensor element 101 and a sensor element 102 are arranged so as to share the detection electrode 20, and in the sensor device 1200, a sensor element 201 and a sensor element 202 are arranged so as to share the detection electrode 20.

The two sensor elements 101, 102 or the sensor elements 201, 202, thus arranged, are housed in a cylindrical container 410 and pressed and fixed by the bases 301, 302. The detection electrode 20 and the GND electrode 30 are electrically connected to an arithmetic unit 510. The arithmetic unit 510 includes a QV amplifier, not shown, which converts the electric charge obtained by the detection electrode 20, and also includes GND (ground) connected with the GND electrode 30.

FIG. 7B shows the arrangement of the sensor elements 101, 102 in the sensor device 1100. As shown in FIG. 7B, the sensor element 101 and the sensor element 102 are stacked along an illustrated stacking direction N, with the γ directions of the sensor elements aligned, as in the sensor element 100 according to the first embodiment. Here, the sensor element 101 and the sensor element 102 are arranged so that the α directions and γ directions of the sensor elements become opposite to each other so that electric charge of the same polarity is generated on the surface 10a that contacts the detection electrode 20, of the rock crystal substrate 10 on the upper side in the illustrated N direction, and on the surface 10b of the rock crystal substrate 10 on the lower side in the illustrated N direction, when a force along an illustrated L direction is detected in the sensor device 1100.

FIG. 7C shows the arrangement of the sensor elements 201, 202 in the sensor device 1200. As shown in FIG. 7C, the sensor element 201 and the sensor element 202 are arranged with the sides of each sensor element reversed to each other, that is, so that the one substrate surface 40a of the rock crystal substrate 40 contacts the detection electrode 20. Thus, when a force along the N direction, that is, a force in the compressing direction is applied, electric charge of the same polarity can be generated on the one substrate surface 40a of the two rock crystal substrates 40 contacting the detection electrode 20.

By employing such a configuration, electric charge can be generated in the two rock crystal substrates 10 or rock crystal substrates 40 by a force applied between the base 301 and the base 302, and about twice the electric charge in the sensor device 1000 can be obtained. Therefore, the sensor devices 1100, 1200 can easily detect even a very small force.

Fourth Embodiment

Figure 8A:
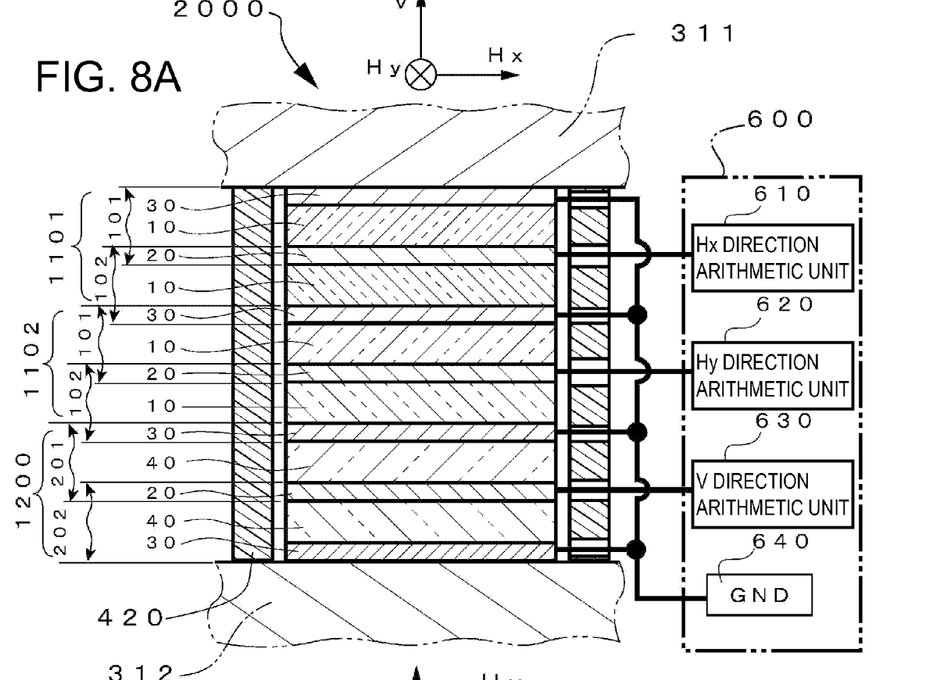
FIG. 8A is a sectional view.
Figure 8B:
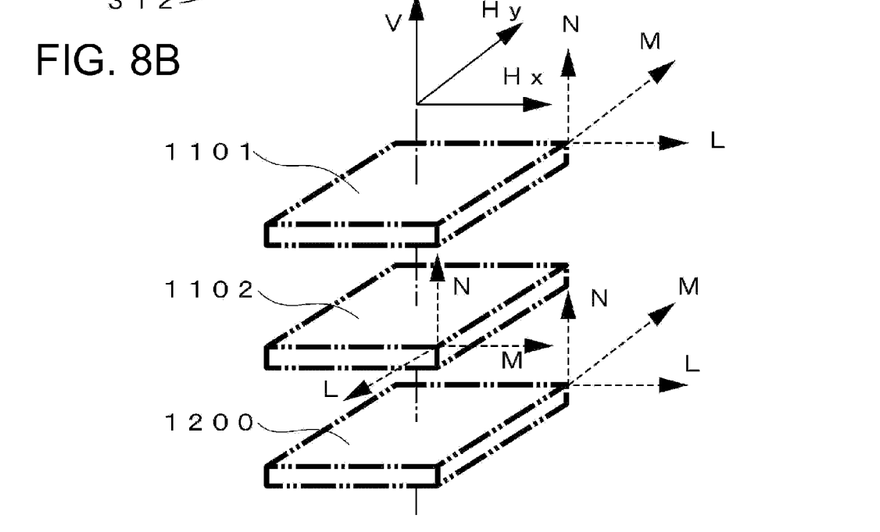
FIG. 8B is a conceptual view showing the arrangement of sensor devices.

FIGS. 8A and 8B show a force detecting device according to a fourth embodiment. FIG. 8A is a sectional view. FIG. 8B is a conceptual view showing the arrangement of sensor devices. In FIG. 8A, a direction in which electrodes and rock crystal substrates are stacked (upward direction in FIG. 8A) is defined as a V(+) direction. A rightward direction in FIG. 8A, orthogonal to the V direction is an Hx(+) direction. A direction heading toward FIG. 8A from the viewer is an Hy(+) direction. In a force detecting device 2000 shown in FIG. 8A, electrodes and rock crystal substrates are alternately stacked within a cylindrical container 420 between a base 311 and a base 312 and are pressed and fixed by the base 311 and the base 312.

The electrodes and the rock crystal substrates housed in the cylindrical container 420 are stacked as follows. From the side of the base 311, a sensor device 1101 in which sensor elements 101, 102 are stacked in the same configuration as the sensor device 1100 according to the another form of the third embodiment, followed by a sensor device 1102 in which sensor elements 101, 102 are stacked in the same configuration as the sensor device 1100, and then a sensor device 1200 in which sensor elements 201, 202 are stacked. In the sensor devices 1101, 1102, 1200 thus stacked, the GND electrodes 30 except the GND electrode contacting the bases 311, 312 are shared by the sensor devices 1101, 1102, 1200.

As shown in FIG. 8B, the arrangement of the sensor device 1102 is in a direction that results from rotating the sensor device 1101 by an angle of 90° about the V-axis. That is, the L-axis of the sensor device 1101 which detects a force along the L-axis is aligned with the Hx-axis, and the sensor device 1102 is arranged by rotating the L-axis by an angle of 90° about the V-axis and aligning the L-axis with the Hy-axis. Thus, forces along the Hx-axis and Hy-axis can be detected. Moreover, the sensor device 1200 which detects a force in the N-axis direction is arranged by aligning the N-axis with the V-axis. Thus, a force along the V-axis can be detected. In this manner, the force detecting device 2000 incorporating the sensor devices 1101, 1102, 1200 can detect forces in the Hx, Hy and V directions, that is, in triaxial directions.

If a force is applied to the bases 311, 312 of the force detecting device 2000 thus configured, based on the electric charge generated in the sensor device 1101, 1102, 1200, vector data of the applied external force including force components of Hx, Hy and V directions obtained by an Hx direction arithmetic unit 610 based on the electric charge of the sensor device 1101, by an Hy direction arithmetic unit 620 based on the electric charge of the sensor device 1102, and by a V direction arithmetic unit 630 based on the electric charge of the sensor device 1200, are outputted to a control device, not shown, with the Hx, Hy and V direction arithmetic units 610, 620, 630 being provided in an arithmetic device 600 as an arithmetic unit. The electric charge excited in the GND electrode 30 is grounded and discharged by GND 640 provided in the arithmetic device 600.

As described above, the force detecting device 2000 according to this embodiment can be a small-sized force detecting device by having electrodes and rock crystal substrates as piezoelectric substrates stacked in one direction. Also, the force detecting device of this embodiment can be formed by stacking electrodes and rock crystal substrates of simple shapes and therefore can be a low-cost force detecting device.

Figure 9A:
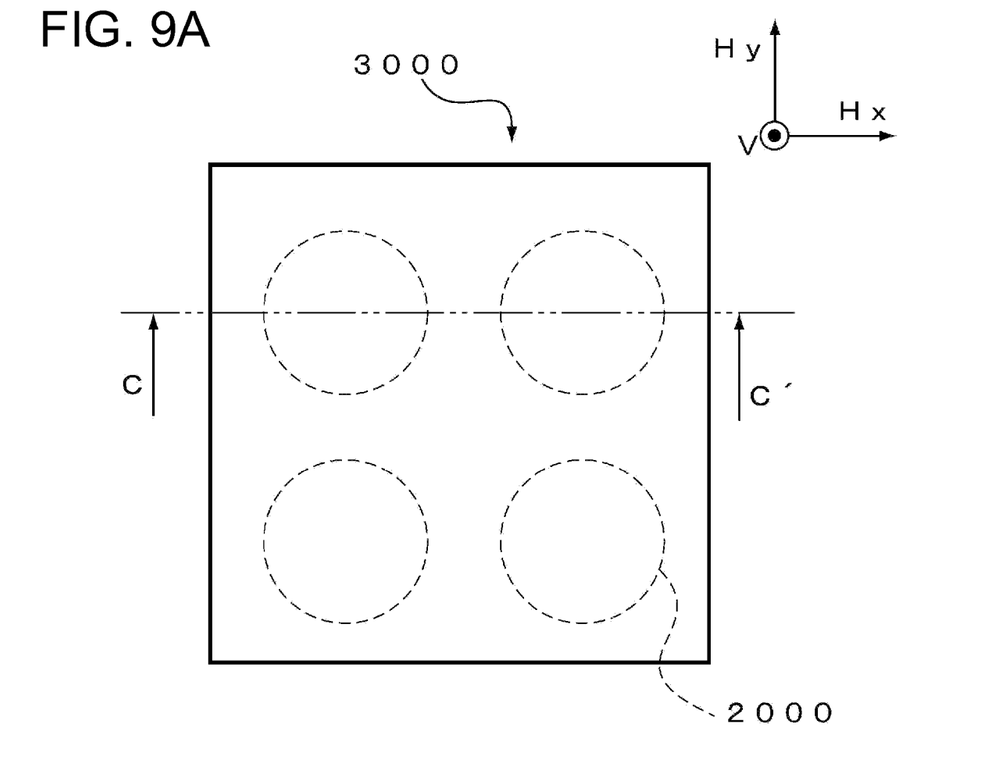
FIG. 9A is a plan view.
Figure 9B:
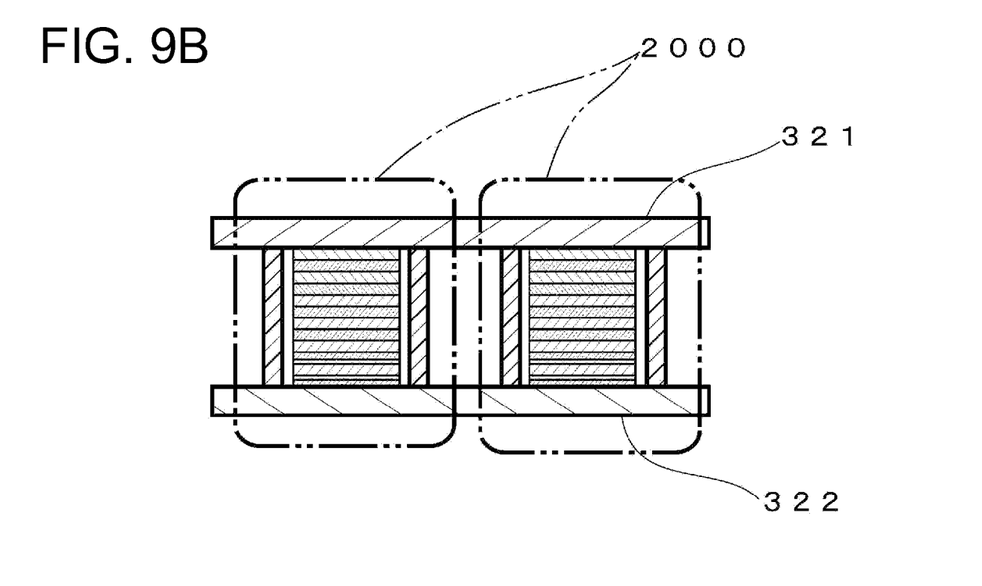
FIG. 9B is a sectional view taken along C-C' in FIG. 9A.

FIGS. 9A and 9B schematically show a six-axis force detecting device 3000 which uses the force detecting device 2000 according to the above embodiment and is capable of torque detection. FIG. 9A is a plan view. FIG. 9B is a sectional view taken along C-C' shown in FIG. 9A. As shown in FIGS. 9A and 9B, the six-axis force detecting device 3000 has a configuration in which four force detecting devices 2000 are fixed by bases 321, 322. By employing this six-axis force detecting device 3000, it is possible to find the torque about each of the Hx-axis, Hy-axis and V-axis based on the distance between the four force detecting devices 2000 that are arranged and the force obtained by each force detecting device 2000.

Fifth Embodiment

Figure 10:
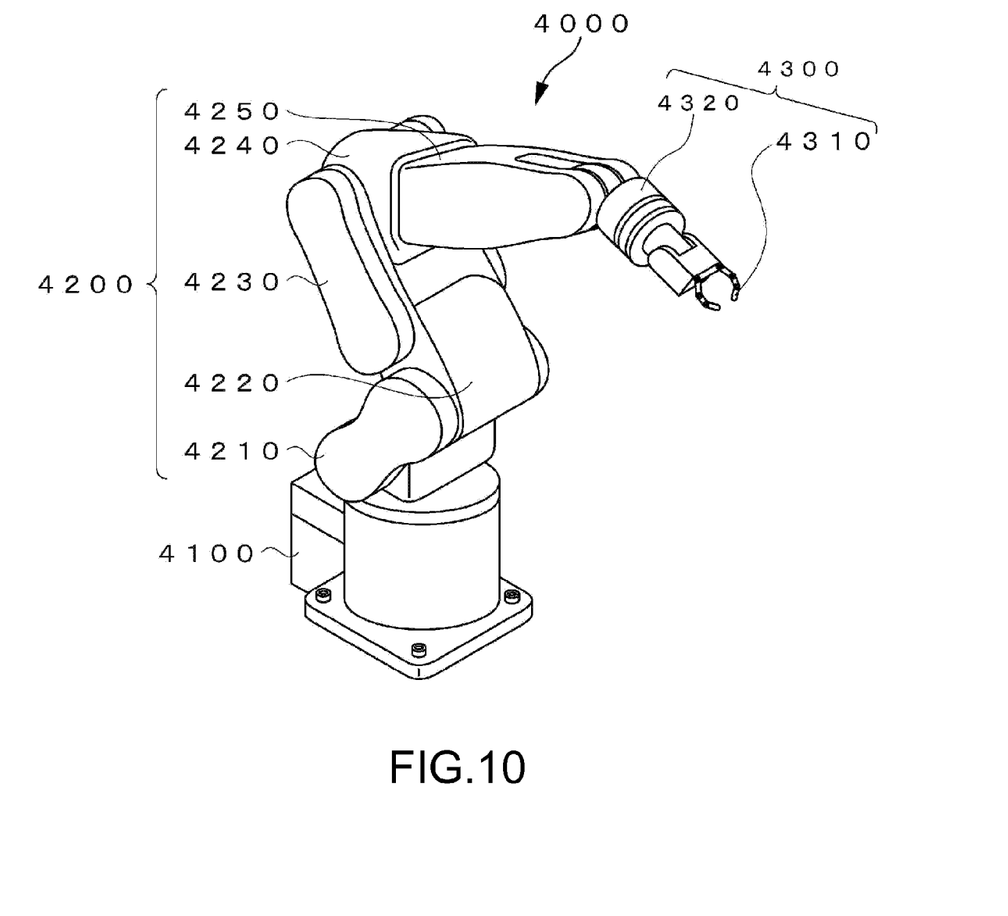
FIG. 10 shows the configuration of a robot according to a fifth embodiment.

FIG. 10 is an external view showing the configuration of a robot 4000 using the force detecting device 2000 according to the third embodiment or the six-axis force detecting device 3000. The robot 4000 includes a body portion 4100, an arm portion 4200, a robot hand portion 4300 and the like. The body portion 4100 is fixed, for example, on a floor, wall, ceiling, movable trolley or the like. The arm portion 4200 is provided movably in relation to the body portion 4100. An actuator, not shown, which generates a motive force to rotate the arm portion 4200, a control unit which controls the actuator, and the like are arranged inside the body portion 4100.

The arm portion 4200 includes a first frame 4210, a second frame 4220, a third frame 4230, a fourth frame 4240 and a fifth frame 4250. The first frame 4210 is connected to the body portion 4100 in a rotatable or bendable manner via a rotation-bending axis. The second frame 4220 is connected to the first frame 4210 and the third frame 4230 via a rotation-bending axis. The third frame 4230 is connected to the second frame 4220 and the fourth frame 4240 via a rotation-bending axis. The fourth frame 4240 is connected to the third frame 4230 and the fifth frame 4250 via a rotation-bending axis. The fifth frame 4250 is connected to the fourth frame 4240 via a rotation-bending axis. Under the control of the control unit, the arm portion 4200 operates as each of the frames 4210 to 4250 rotates or bends in a complex manner about each rotation-bending axis.

The robot hand portion 4300 is attached on the side of the fifth frame 4250 of the arm portion 4200 that is opposite to the connecting part with the fourth frame 4240. The robot hand portion 4300 includes a robot hand 4310 which can grip an object, and a robot hand connecting portion 4320 in which a motor to rotate the robot hand 4310 is arranged. The robot hand portion 4300 is connected to the fifth frame 4250 by the robot hand connecting portion 4320.

In the robot hand connecting portion 4320, the force detecting device 2000 according to the third embodiment or the six-axis force detecting device 3000 is arranged in addition to the motor. Thus, when the robot hand portion 4300 is moved to a predetermined operating position under the control of the control unit, contact with an obstacle or contact with an object in response to an operation command to exceed a predetermined position, or the like, can be detected as a force by the force detecting device 2000 or the six-axis force detecting device 3000. This force can be fed back to the control unit of the robot 4000 so that an evasive action can be executed.

Using such a robot 4000, a robot that can easily carry out an obstacle avoiding operation, an object damage avoiding operation and the like, which cannot be realized by traditional position control, and that can perform safe and fine work, can be provided. The technique is not limited to this embodiment and can also be applied to, for example, a two-arm robot.

Example

Figure 11A:
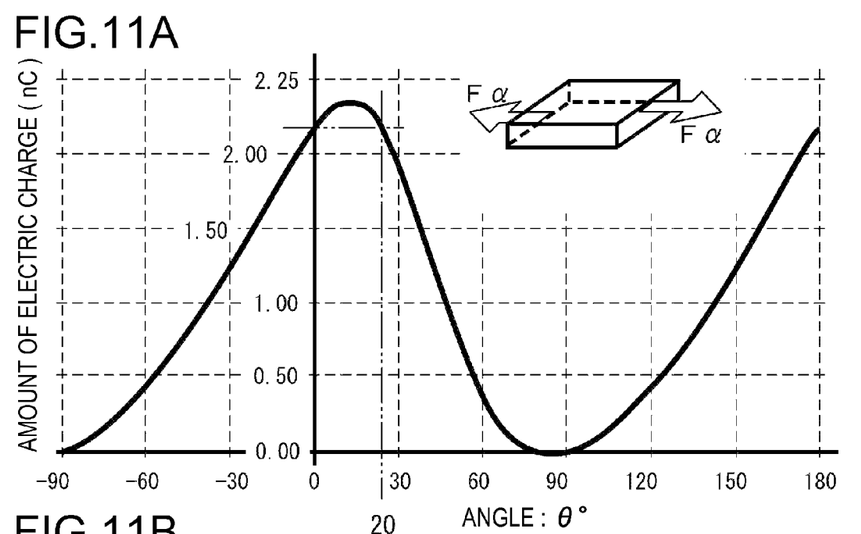
FIG. 11A shows an example of implementation of the sensor element according to the first embodiment.
Figure 11B:
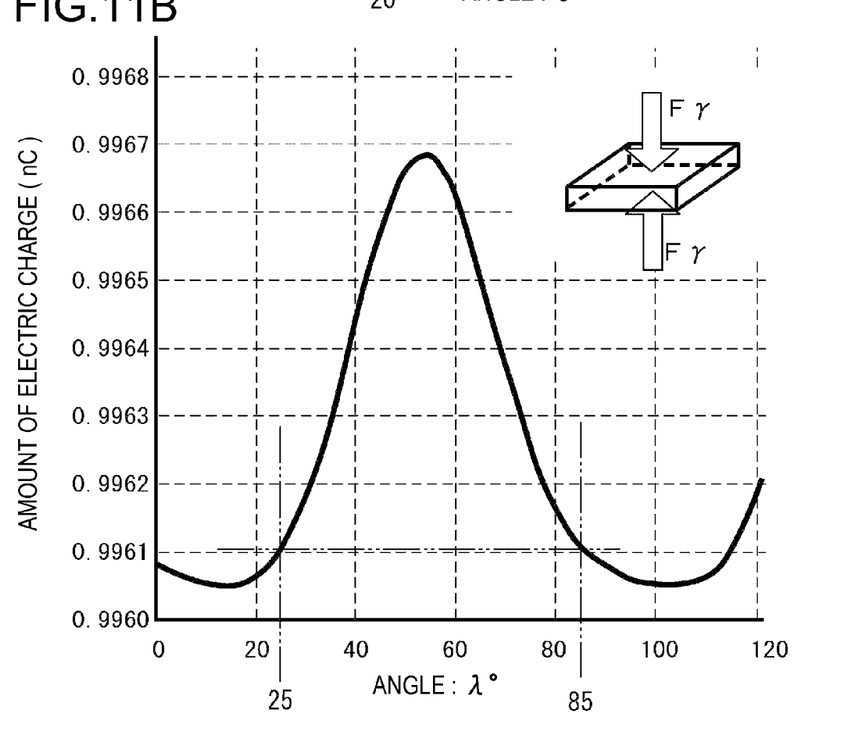
FIG. 11B shows an example of implementation of the sensor element according to the second embodiment.

FIGS. 11A and 11B are graphs showing the amount of electric charge generated when a force is applied to the sensor element 100 according to the first embodiment and the sensor element 200 according to the second embodiment. The result of calculating the amount of electric charge in relation to the angle $\theta$ in the case of the sensor element 100 is shown in FIG. 11A. The result of calculating the amount of electric charge in relation to the angle $\lambda$ in the case of the sensor element 200 is shown in FIG. 11B. The piezoelectric substrate is made of a rock crystal with a plane size of 5 mm by 5 mm and a thickness of 200 μm. F$\alpha$=500N and F$\gamma$=500N are applied in the illustrated directions.

As shown in FIG. 11A, in the case where the sensor element 100 according to the first embodiment is used, compared with a general Y-cut plate with $\theta$=0°, an amount of electric charge exceeding the amount of electric charge in the case of $\theta$=0° can be obtained if $\theta$ is increased within a range of 0°<$\theta$<20°.

As shown in FIG. 11B, in the case where the sensor element 200 according to the second embodiment is used, compared with a general X-cut plate with $\lambda$=0°, an amount of electric charge exceeding the amount of electric charge in the case of $\lambda$=0° can be obtained if $\lambda$ is within a range of 25°≤$\lambda$≤85°.

The entire disclosure of Japanese Patent Application No. 2011-244208 filed Nov. 8, 2011 is expressly incorporated by reference herein.

What is claimed is:

1. A sensor element comprising:
a piezoelectric substrate made of a trigonal single crystal having crystal axes;
a first electrode on a first surface of the piezoelectric substrate; and
a second electrode on a second surface, the first and second surfaces being on opposite sides of the piezoelectric substrate,
wherein the first surface of the piezoelectric substrate includes an electrical axis, a mechanical axis, and an optical axis of the crystal axes, and
an angle $\theta$ between the first surface and a plane including the electrical axis and an optical axis of the crystal axes is 0°<$\theta$<20°,
a portion of an outer side surface that is different from the first and second surfaces of the piezoelectric substrate includes a plane, and
an angle $\lambda$ between the plane of the outer side surface and a plane including an electrical axis and the optical axis of the crystal axes is 25°≤$\lambda$≤85°.

2. The sensor element according to claim 1, wherein
a portion of an outer side surface extending between the first and second surfaces of the piezoelectric substrate includes a plane extending in the electrical axis direction.

3. The sensor element according to claim 1, wherein the single crystal is a rock crystal.

4. A force detecting device comprising:
the sensor element according to claim 1; and
an arithmetic unit which detects an amount of electric charge induced in the first electrode or the second electrode and calculates a force applied to the sensor element.

5. A robot comprising:
the sensor element according to claim 1; and
an arithmetic unit which detects an amount of electric charge induced in the first electrode or the second electrode and calculates a force applied to the sensor element.

6. A robot comprising:
four sensor units, each of the senor units including:
a piezoelectric substrate including a trigonal single crystal having crystal axes;
a first electrode on a first surface of the piezoelectric substrate; and
a second electrode on a second surface, the first and second surfaces being on opposite sides of the piezoelectric substrate;
an arithmetic unit which detects an amount of electric charge induced in the first or second electrode and calculates a force applied to the piezoelectric substrate;
a rotatable arm portion; and
a hand portion supported on the arm portion via the piezoelectric substrate, the hand portion being adapted to grip an object;
wherein the first surface of the piezoelectric substrate includes an electrical axis of the crystal axes, and
an angle $\theta$ between the first surface and a plane including the electrical axis and an optical axis of the crystal axes is 0°<$\theta$<20°.

7. The robot according to claim 6, wherein the single crystal is a rock crystal.

8. A robot comprising:
four sensor units, each of the senor units including:
a piezoelectric substrate including a trigonal single crystal having crystal axes;
a first electrode on a first surface of the piezoelectric substrate;
a second electrode on a second surface, the first and second surfaces being on opposite sides of the piezoelectric substrate;
an arithmetic unit which detects an amount of electric charge induced in the first electrode or the second electrode and calculates a force applied to the piezoelectric substrate;
a rotatable arm portion; and
a hand portion supported on the arm portion via the sensor element, the hand portion being adapted to grip an object;
wherein the first surface of the piezoelectric substrate includes a mechanical axis and an optical axis of the crystal axes,
an outer side surface being different from the first and second surfaces of the piezoelectric substrate includes a plane, and
an angle $\lambda$ between the plane of the outer surface and a plane including an electrical axis and the optical axis of the crystal axes is $25° \leq \lambda \leq 85°$.

9. The robot according to claim 8, wherein the single crystal is a rock crystal.

10. A robot comprising:
six piezoelectric substrates including a trigonal single crystal having crystal axes; and
plural electrodes cooperatively arranged on the six piezoelectric substrates;
wherein four of the six piezoelectric substrates have a first surface that includes an electrical axis of the crystal axes, and an angle $\theta$ between the first surfaces and a plane including the electrical axis and an optical axis of the crystal axes is $0° < \theta < 20°$;
two of the six piezoelectric substrates have a second surface that includes a mechanical axis and the optical axis of the crystal axes, and an angle $\lambda$ between a plane of an outer side surface that intersects the second surfaces of each of the two piezoelectric substrates, and a plane including the electrical axis and the optical axis is $25° \leq \lambda \leq 85°$.

* * * * *